(12) United States Patent
Nakabayashi et al.

(10) Patent No.: US 10,959,359 B2
(45) Date of Patent: Mar. 23, 2021

(54) POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Shigeyuki Nakabayashi, Chuo-ku (JP); Hitoshi Sadakuni, Chuo-ku (JP); Shotaro Murakami, Chuo-ku (JP); Ikuto Udagawa, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/624,004

(22) PCT Filed: Jun. 30, 2017

(86) PCT No.: PCT/JP2017/024207
§ 371 (c)(1),
(2) Date: Dec. 18, 2019

(87) PCT Pub. No.: WO2019/003432
PCT Pub. Date: Jan. 3, 2019

(65) Prior Publication Data
US 2020/0113093 A1    Apr. 9, 2020

(51) Int. Cl.
*H05K 5/00* (2006.01)
*H05K 9/00* (2006.01)
(Continued)

(52) U.S. Cl.
CPC ........... *H05K 9/0067* (2013.01); *H01B 17/56* (2013.01); *H02M 5/42* (2013.01); *H05K 7/023* (2013.01)

(58) Field of Classification Search
USPC ....................................................... 361/730
See application file for complete search history.

(56) References Cited

U.S. PATENT DOCUMENTS

2015/0207322 A1* 7/2015 Nakao ................... H02M 5/42
307/23
2018/0041135 A1* 2/2018 Onishi ................... H02M 7/25

FOREIGN PATENT DOCUMENTS

JP  51-155318     12/1976
JP  10-323015 A   12/1998
(Continued)

OTHER PUBLICATIONS

International Search Report dated Aug. 29, 2017 in PCT/JP2017/024207 filed on Jun. 30, 2017, citing references AP-AR therein, 2 pages.
(Continued)

*Primary Examiner* — Hung S. Bui
(74) *Attorney, Agent, or Firm* — Oblon, McClelland, Maier & Neustadt, L.L.P.

(57) ABSTRACT

A power conversion device includes a first stage, a second stage, a first electric field relaxation shield unit, a second electric field relaxation shield unit, and a plurality of stage posts. The first electric field relaxation shield unit is arranged to surround outer periphery of the first stage. The second electric field relaxation shield unit is arranged to surround outer periphery of the second stage. The plurality of stage posts connect the first stage and the second stage. The plurality of stage posts have outer peripheral surfaces formed of insulating bodies. Power conversion units loaded on the first stage are arranged inside a columnar region which includes at least some of the plurality of stage posts as sides.

6 Claims, 4 Drawing Sheets

(51) Int. Cl.
*H01B 17/56* (2006.01)
*H02M 5/42* (2006.01)
*H05K 7/02* (2006.01)

(56) References Cited

FOREIGN PATENT DOCUMENTS

JP          2000-174205 A     6/2000
WO      WO 2016/162915 A1   10/2016

OTHER PUBLICATIONS

Notice of Reasons for Refusal dated May 12, 2020 in Japanese Patent Application No. 2019-526107 (with English language translation), 6 pages.

\* cited by examiner

POWER CONVERSION DEVICE

TECHNICAL FIELD

The present disclosure relates to a power conversion device including stacked stages that load power conversion units.

BACKGROUND ART

Conventionally, power conversion devices including stacked stages that load power conversion units have been known. For example, Japanese Patent Laying-Open No. 10-323015 (PTL 1) discloses a semiconductor power conversion device including stacked stages that load a high-speed switching element stack and a high-speed diode stack.

CITATION LIST

Patent Literature

PTL 1: Japanese Patent Laying-Open No. 10-323015

SUMMARY OF INVENTION

Technical Problem

Potential difference may arise between stages that load power conversion units and between each stage and the ground. In order to prevent atmospheric partial discharge due to electric field concentration, an electric field relaxation shield may be arranged between the stages.

For example, in the case of a power conversion device used for ultra high-voltage direct current transmission, the number of stacked stages may increase. When an electric field relaxation shield with a shape covering the entire stages is provided between the stages, the manufacturing cost and assembling cost of the power conversion device may increase.

The present disclosure has been made to solve the aforementioned problem, and an object thereof is to suppress the manufacturing cost and assembling cost of a power conversion device.

Solution to Problem

A power conversion device in accordance with the present disclosure includes first and second stages, first and second electric field relaxation shield units, and a plurality of stage posts. The first stage loads at least one first power conversion unit. The second stage loads at least one second power conversion unit. The second stage is stacked on the first stage. The first electric field relaxation shield unit is arranged to surround outer periphery of the first stage. The second electric field relaxation shield unit is arranged to surround outer periphery of the second stage. The plurality of stage posts connect the first stage and the second stage. The plurality of stage posts have outer peripheral surfaces formed of insulating bodies. All the first power conversion units loaded on the first stage are arranged inside a columnar region which includes at least some of a plurality of stage posts as sides.

In the power conversion device in accordance with the present disclosure, the plurality of stage posts connecting the first stage and the second stage have outer peripheral surfaces formed of insulating bodies. In addition, all the first power conversion units loaded on the first stage are arranged inside the columnar region which includes at least some of the plurality of stage posts as the sides. Thus, atmospheric partial discharge at a portion where metal is exposed can be suppressed by the plurality of stage posts rather than electric field relaxation shields. As a result, the first electric field relaxation shield unit can have a simple and light-weight structure which does not have a portion arranged between the first stage and the second stage.

Advantageous Effects of Invention

According to the power conversion device in accordance with the present disclosure, manufacturing cost and assembling cost can be decreased.

DESCRIPTION OF EMBODIMENTS

Figure 1:
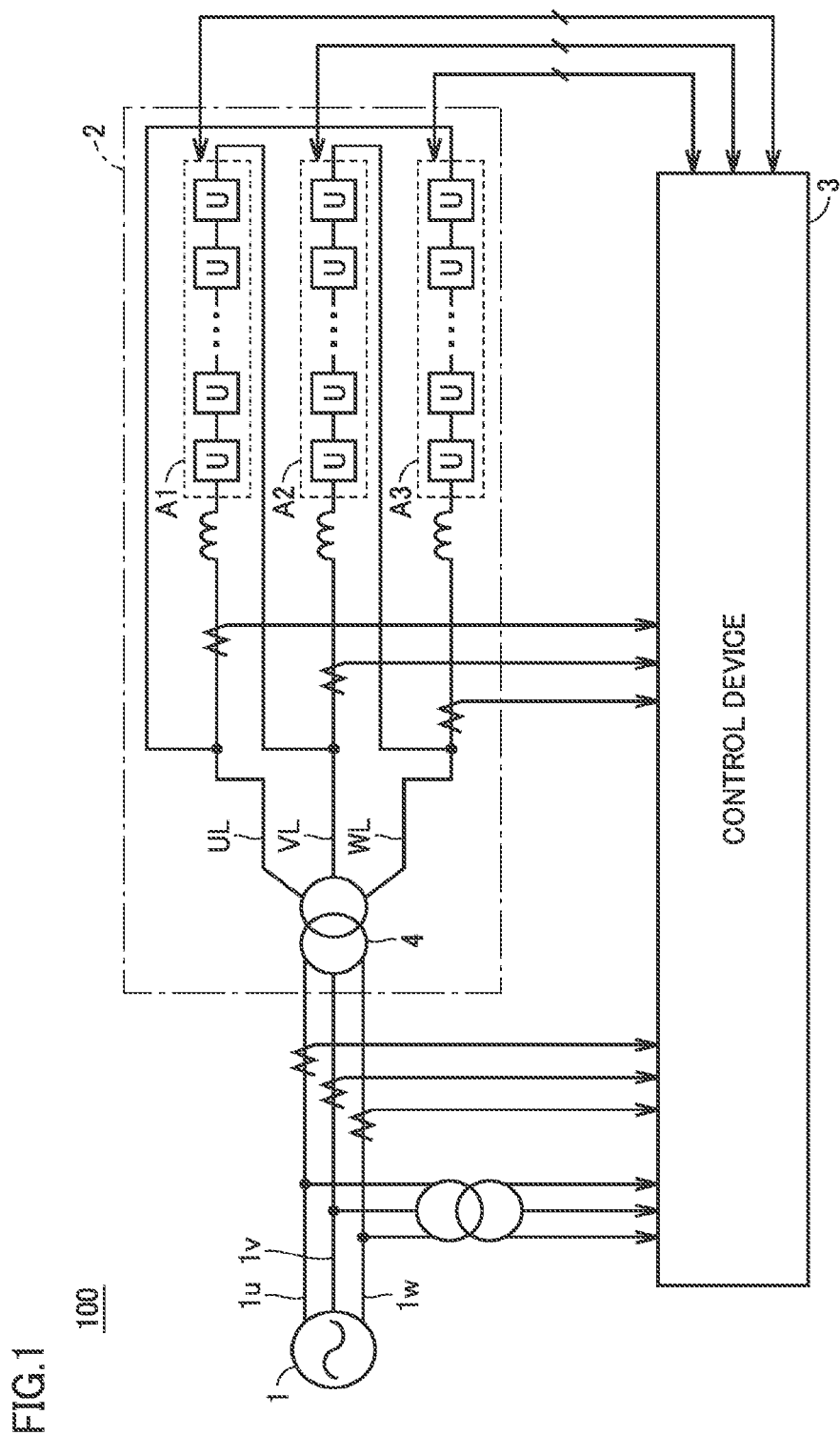
FIG. 1 is a circuit block diagram showing a configuration of a power conversion device in accordance with an embodiment.

FIG. 1 is a circuit block diagram showing a configuration of a power conversion device 100 in accordance with an embodiment. As shown in FIG. 1, power conversion device 100 includes a modular multilevel converter (hereinafter referred to as an MMC) 2, and a control device 3 for controlling MMC 2. According to power conversion device 100 including MMC 2 which can achieve high breakdown voltage and large capacity, ultra high-voltage direct current (UHVDC) transmission can be performed, for example.

MMC 2 is connected to a power system 1 via a transformer 4. MMC 2 includes transformer 4 and three-phase (U, V, and W-phase) alternating current (AC) lines UL, VL, and WL. Transformer 4 includes three primary windings and three secondary windings. The three primary windings are connected to three-phase power transmission lines 1u, 1v, and 1w, respectively, of power system 1. The three secondary windings are connected to one terminals of AC lines UL, VL, and WL, respectively.

MMC 2 further includes arms A1 to A3. Arm A1 is connected between the other terminal of AC line UL and the other terminal of AC line VL. Arm A2 is connected between the other terminal of AC line VL and the other terminal of AC line WL. Arm A3 is connected between the other terminal of AC line WL and the other terminal of AC line UL. That is, arms A1 to A3 are connected by delta connection.

Each of arms A1 to A3 has a plurality of power conversion units U connected in series. Each of the plurality of power conversion units U performs bidirectional power conversion according to a control signal from control device 3.

Figure 2:
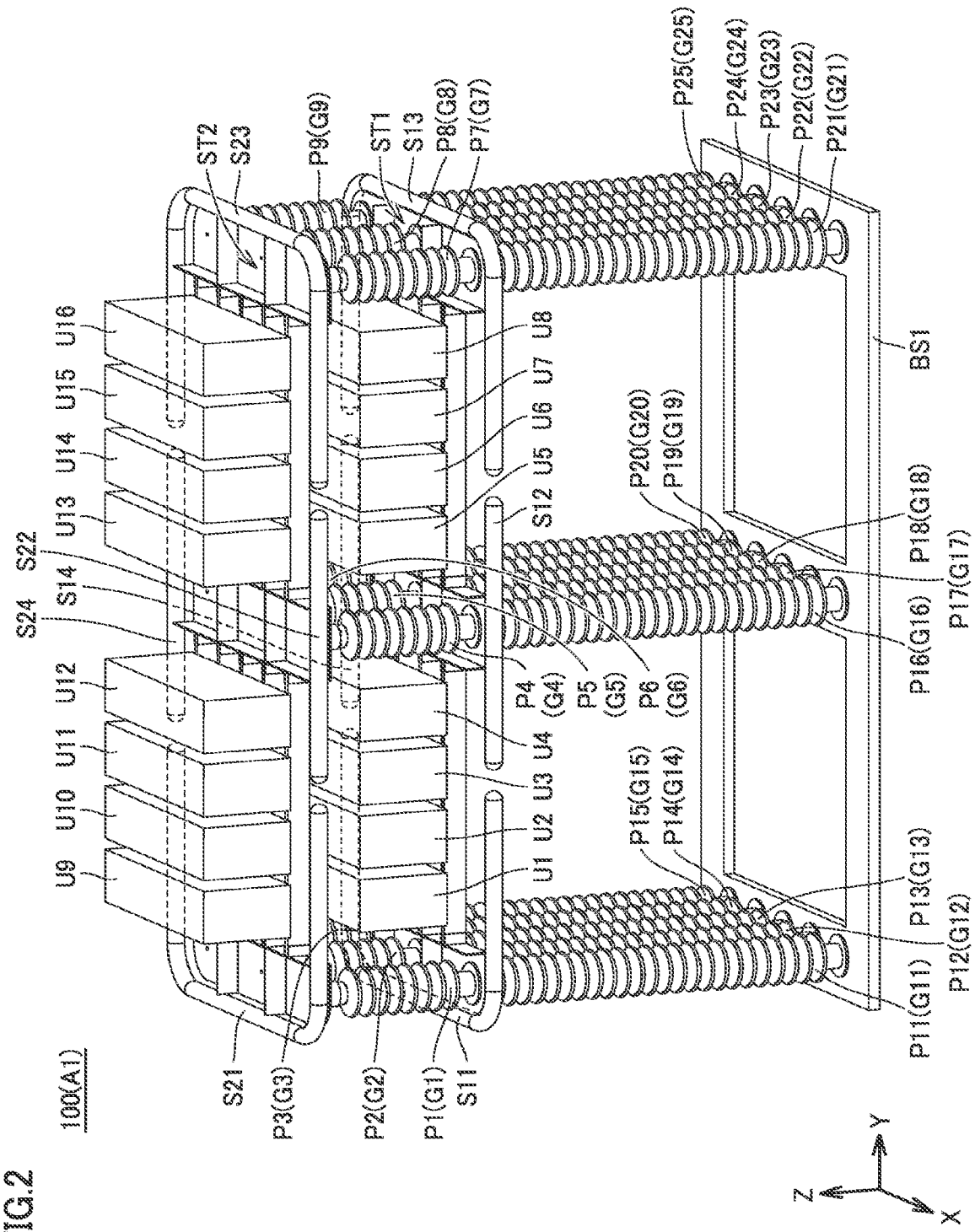
FIG. 2 is a perspective view of an appearance of an arm in FIG. 1.
Figure 3:
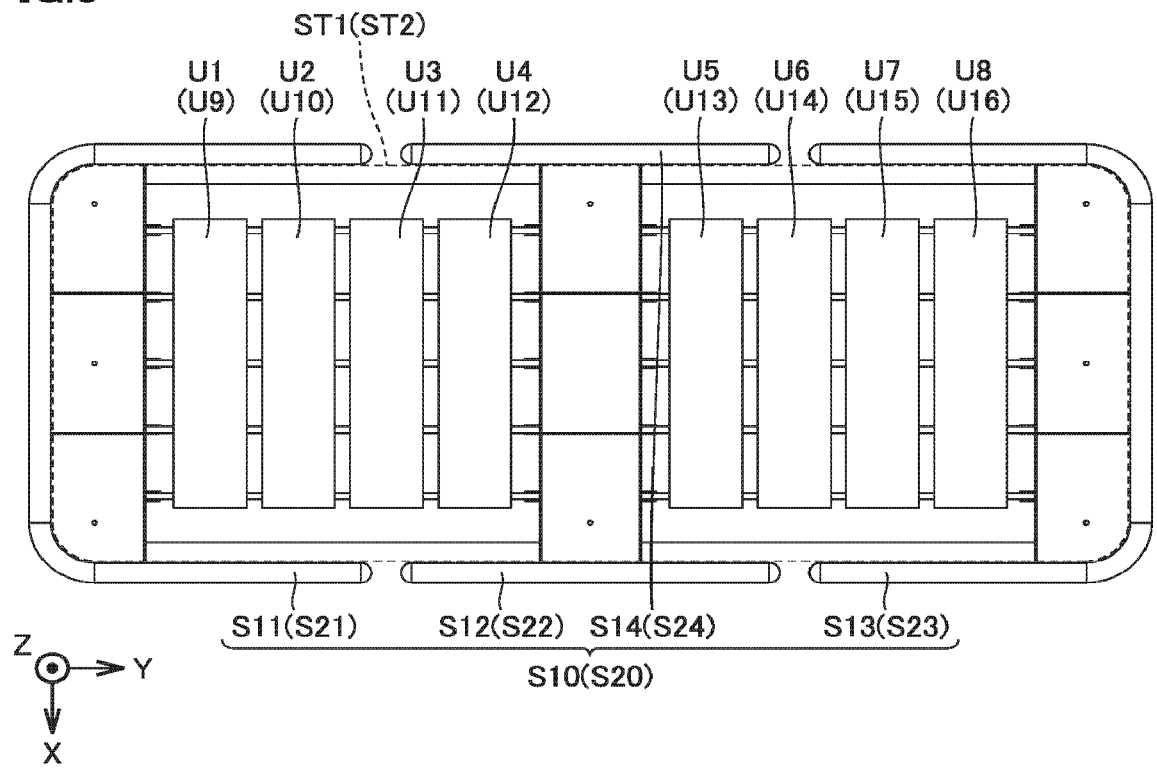
FIG. 3 is a top view of stages in FIG. 2 viewed in a Z-axis direction.

FIG. 2 is a perspective view of an appearance of arm A1 in FIG. 1. FIG. 3 is a top view of stages ST1 and ST2 in FIG. 2 viewed in a Z-axis direction. As shown in FIGS. 2 and 3, power conversion device 100 includes power conversion units U1 to U16, stages ST1 and ST2, electric field relaxation shield units S10 and S20, stage posts P1 to P9, a base BS1, and base posts P11 to P25. Each of power conversion units U1 to U16 corresponds to power conversion unit U in FIG. 1. Power conversion units U1 to U16 are connected in series.

Base BS1 and stage ST1 are connected by base posts P11 to P25 extending in the Z-axis direction. Stage ST1 loads power conversion units U1 to U8. Base posts P11 to P25 include insulators G11 to G25, respectively, at outer peripheral portions. That is, base posts P11 to P25 have outer peripheral surfaces formed of insulating bodies. Since the outer peripheral surfaces of base posts P11 to P25 are formed of insulating bodies, even when potential difference arises between base BS1 and stage ST1 during operation of power conversion device 100, atmospheric partial discharge occurring from protruding portions of stages ST1 and ST2 can be suppressed by electric field relaxation shield units S10 and S20.

Stage ST2 and stage ST1 are connected by stage posts P1 to P9 extending in the Z-axis direction. Stage ST2 loads power conversion units U9 to U16. Stage posts P1 to P9 include insulators G1 to G9, respectively, at outer peripheral portions. That is, stage posts P1 to P9 have outer peripheral surfaces formed of insulating bodies. Since the outer peripheral surfaces of stage posts P1 to P9 are formed of insulating bodies, even when potential difference arises between stage ST1 and stage ST2 during operation of power conversion device 100, atmospheric partial discharge occurring from the protruding portions of stages ST1 and ST2 can be suppressed by electric field relaxation shield units S10 and S20.

Electric field relaxation shield unit S10 is arranged to surround the outer periphery of stage ST1. Electric field relaxation shield unit S10 includes electric field relaxation shields S11 to S14. Electric field relaxation shield unit S10 relaxes an electric field concentrating on the protruding portion at an outer edge of stage ST1. Electric field relaxation shield unit S10 can suppress atmospheric partial discharge occurring at the protruding portion.

Electric field relaxation shield unit S20 is arranged to surround the outer periphery of stage ST2. Electric field relaxation shield unit S20 includes electric field relaxation shields S21 to S24. Electric field relaxation shield unit S20 relaxes an electric field concentrating on the protruding portion at an outer edge of stage ST2.

Electric field relaxation shield unit S20 can suppress atmospheric partial discharge occurring at the protruding portion.

Since each electric field relaxation shield unit is formed of a plurality of electric field relaxation shields, the electric field relaxation shields can be arranged at appropriate positions, and thus the electric field relaxation shields can be easily arranged to conform to the shape of each stage. In addition, the electric field relaxation shields can be placed in an empty space during storage, and thus a space required during storage of each electric field relaxation shield unit can be reduced.

Figure 4:
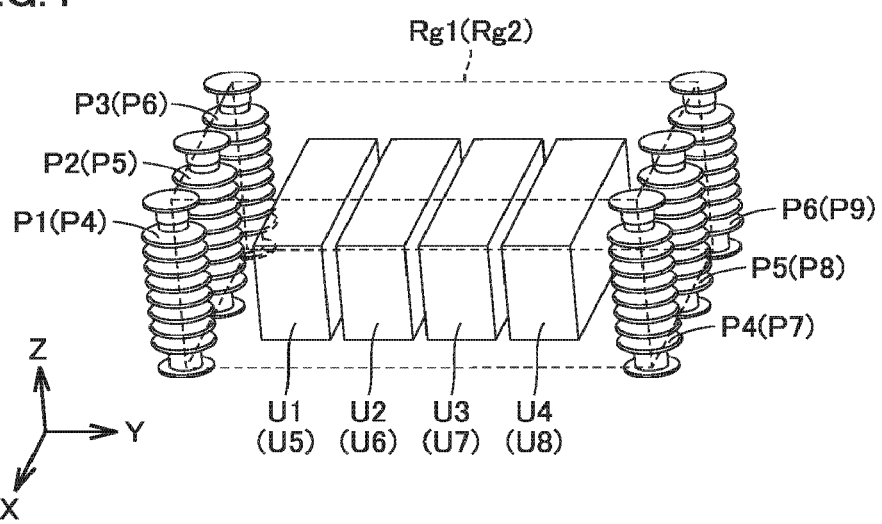
FIG. 4 is a view showing a positional relation between power conversion units and stage posts in FIG. 2.

FIG. 4 is a view showing a positional relation between power conversion units U1 to U8 and stage posts P1 to P9 in FIG. 2. As shown in FIG. 4, power conversion units U 1 to U4 are arranged inside a rectangular columnar region Rg1 which includes stage posts P1, P3, P4, and P6 as sides. By arranging power conversion units U1 to U4 inside region Rg1, a separation distance between power conversion units U1 to U4 and the outside can be secured. As a result, atmospheric partial discharge occurring from power conversion units U1 to U4 can be suppressed.

Power conversion units U5 to U8 are arranged inside a rectangular columnar region Rg2 which includes stage posts P4, P6, P7, and P9 as sides. By arranging power conversion units U5 to U8 inside region Rg2, a separation distance between power conversion units U5 to U8 and the outside can be secured. As a result, atmospheric partial discharge occurring from power conversion units U5 to U8 can be suppressed.

Figure 5:
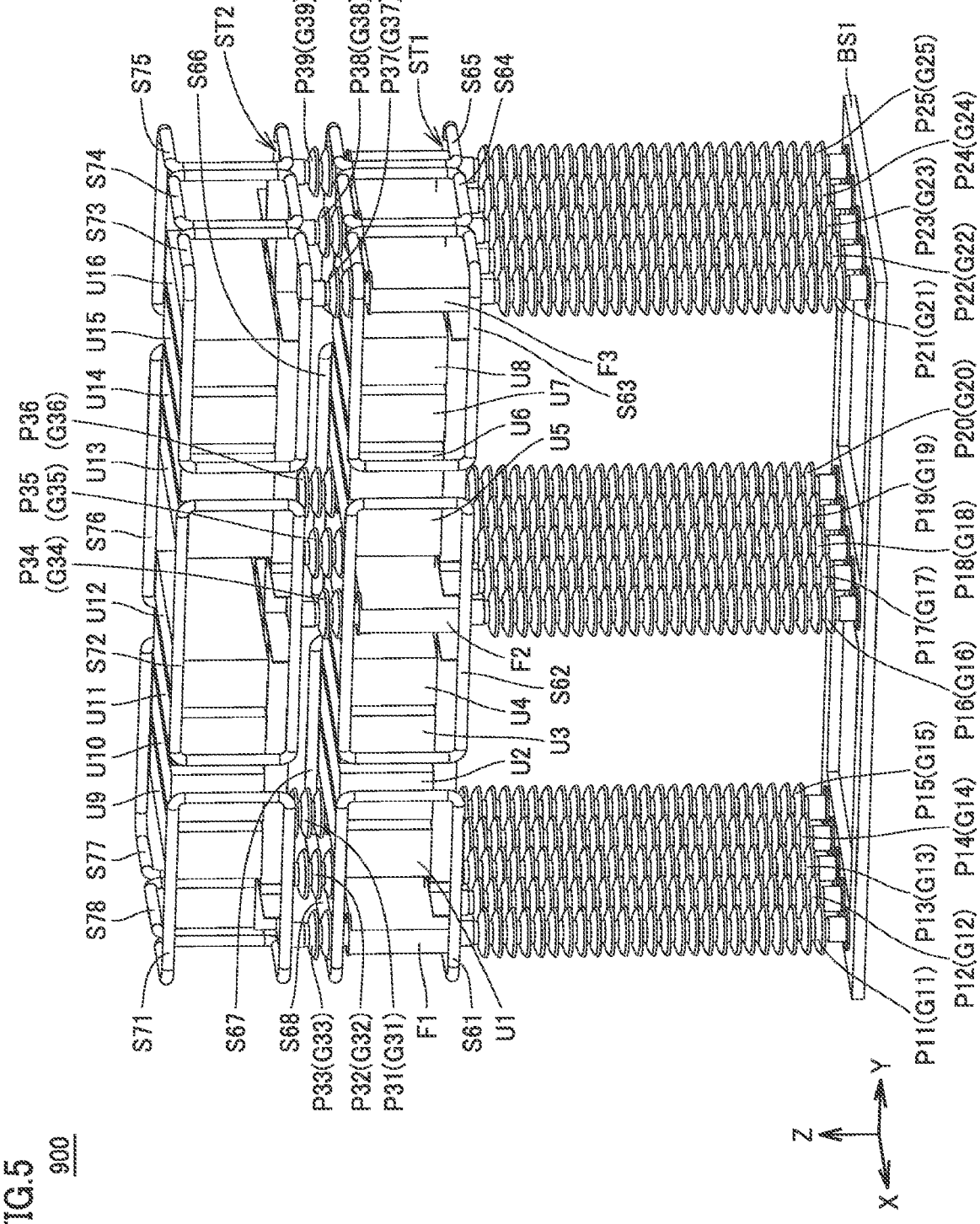
FIG. 5 is a perspective view of an appearance of an arm of a power conversion device in accordance with a comparative example.

FIG. 5 is a perspective view of an appearance of an arm of a power conversion device 900 in accordance with a comparative example. In the configuration of the arm of power conversion device 900, electric field relaxation shields S11 to S14 and S21 to S24 in FIG. 2 are replaced by electric field relaxation shields S61 to S68 and S71 to S78. In the configuration, stage posts P1 to P9 in FIG. 2 are replaced by stage posts P31 to P39, respectively, and insulators G1 to G9 in FIG. 2 are replaced by insulators G31 to G39, respectively. In the configuration, frames F1 to F3 are added to the configuration of arm A1 in FIG. 2. Since the configuration is the same in other respects, the description thereof will not be repeated.

As shown in FIG. 5, frames F1 to F3 extend from stage ST1 in the Z-axis direction. Power conversion units U1 to U4 are arranged between frames F1 and F2. Power conversion units U5 to U8 are arranged between frames F2 and F3.

Stage posts P31 to P33 connect frame F1 and stage ST2. Stage posts P34 to P36 connect frame F2 and stage ST2. Stage posts P37 to P39 connect frame F3 and stage ST2.

During operation of power conversion device 900, potential difference may arise among frames F1 to F3. In power conversion device 900, it is necessary to suppress atmospheric partial discharge occurring at protruding portions of frames F1 to F3 located between stages ST1 and ST2. Electric field relaxation shields S61 to S68 each have a portion arranged between stages ST1 and ST2, relax electric field concentration on the protruding portions of frames F1 to F3, and suppress atmospheric partial discharge.

When comparison is made between electric field relaxation shields S11 to S14 and S21 to S24 in FIG. 2 and electric field relaxation shields S61 to S68 and S71 to S78 in FIG. 5, the electric field relaxation shields shown in FIG. 2 are simpler and have a lighter weight than the electric field relaxation shields shown in FIG. 5, because the former electric field relaxation shields do not have a portion arranged between the stages. Thus, the manufacturing cost and assembling cost of power conversion device 100 in FIG. 2 can be decreased, when compared with the manufacturing cost and assembling cost of power conversion device 900 in FIG. 5.

The embodiment has described a case where two stages that load power conversion units are stacked. The present disclosure is also applicable to a power conversion device including three or more stacked stages that load power conversion units.

As described above, according to the power conversion device in accordance with the present disclosure, manufacturing cost and assembling cost can be decreased.

It should be understood that the embodiment disclosed herein is illustrative and non-restrictive in every respect. The scope of the present disclosure is defined by the scope of the claims, rather than the description above, and is intended to include any modifications within the scope and meaning equivalent to the scope of the claims.

REFERENCE SIGNS LIST

1: power system; 1$u$, 1$v$, 1$w$: power transmission line; 3: control device; 4: transformer; 100, 900: power conversion device; A1, A2, A3: arm; BS1: base; F1 to F3: frame; G1 to G9, G11 to G25, G31 to G39: insulator; P1 to P9, P31 to P39: stage post; P11 to P25: base post; S10, S20: electric field relaxation shield unit; S11 to S14, S21 to S24, S61 to S68, S71 to S78: electric field relaxation shield; ST1, ST2: stage; U, U1 to U16: power conversion unit; UL, VL, WL: AC line.

The invention claimed is:

1. A power conversion device comprising:
a first stage that loads at least one first power conversion unit;
a second stage that loads at least one second power conversion unit and that is stacked on the first stage;
a first electric field relaxation shield unit arranged to surround outer periphery of the first stage;
a second electric field relaxation shield unit arranged to surround outer periphery of the second stage; and
a plurality of stage posts having an entire of outer peripheral surfaces formed of insulating bodies,
each of the plurality of stage posts connecting the first stage and the second stage,
all the first power conversion units loaded on the first stage being arranged inside a columnar region which includes at least some of the plurality of stage posts as sides,
a thickness of the first electric field relaxation shield unit in an extending direction of the plurality of stage posts being thinner than a thickness of each of the at least one first power conversion unit in the extending direction.

2. The power conversion device according to claim 1, further comprising:
a plurality of base posts having outer peripheral surfaces formed of the insulating bodies; and
a base connected with the first stage by the plurality of base posts.

3. The power conversion device according to claim 2, wherein each of the first and second electric field relaxation shield units includes a plurality of electric field relaxation shields.

4. The power conversion device according to claim 1, wherein each of the first and second electric field relaxation shield units includes a plurality of electric field relaxation shields.

5. The power conversion device according to claim 1, wherein a thickness of the second electric field relaxation shield unit in the extending direction is thinner than a thickness of each of the at least one second power conversion unit in the extending direction.

6. The power conversion device according to claim 1, wherein, when viewed in a direction orthogonal to the extending direction, the first electric field relaxation shield unit does not have a portion arranged between the first stage and the second stage.

* * * * *